United States Patent [19]

Yaguchi et al.

[11] Patent Number: 5,161,160
[45] Date of Patent: Nov. 3, 1992

[54] CIRCUIT FOR TESTABILITY

[75] Inventors: Toshiyuki Yaguchi; Koichi Tanaka, both of Kawasaki, Japan

[73] Assignee: Kabushiki Kaisha Toshiba, Kawasaki, Japan

[21] Appl. No.: 472,382

[22] Filed: Feb. 1, 1990

[30] Foreign Application Priority Data

Feb. 7, 1989 [JP] Japan .................................. 1-26593

[51] Int. Cl.$^5$ .......................................... H04B 17/00
[52] U.S. Cl. .................................. 371/22.3; 371/22.5
[58] Field of Search ...................... 371/15.1, 22.3, 22.5

[56] References Cited

U.S. PATENT DOCUMENTS

| | | | |
|---|---|---|---|
| 4,697,267 | 9/1987 | Wakai | 371/22.3 |
| 4,698,588 | 10/1987 | Hwang et al. | 324/73 |
| 4,710,931 | 12/1987 | Bellay et al. | 371/22.3 |
| 4,766,593 | 8/1988 | Cates | 371/15 |
| 4,799,004 | 1/1989 | Mori | 371/22.3 |
| 4,912,395 | 3/1990 | Sato et al. | 371/22.3 |
| 4,974,226 | 11/1990 | Fujimori et al. | 371/22.3 |
| 4,995,039 | 2/1991 | Sakashita et al. | 371/22.3 |

FOREIGN PATENT DOCUMENTS 0292116 11/1988 European Pat. Off. .

Primary Examiner—Jerry Smith
Assistant Examiner—Ly V. Hua
Attorney, Agent, or Firm—Foley & Lardner

[57] ABSTRACT

An evaluation facilitating circuit incorporated in a logic circuit having a plurality of functional blocks, includes: many scan register groups obtained by dividing many F/Fs provided in each functional block, many scan paths for scanning a plurality of test data used for input and output operations for the scan register groups, wherein a scan path is provided for each scan register group, and a decoder for designating the scan paths and controlling the input and output operations of test signals used for testing the scan register groups. A first scan register group in each functional group is composed of scan registers only used for the input operations to other functional blocks, a second scan register group is composed of scan registers only used for the output operations to other functional blocks and a third scan register group is composed of scan registers used for the input and output operations to the same functional block. Each scan path is connected to a common bus provided in the functional circuit. The common bus includes many signal lines through which the test data is transferred, and the scan path connected to a first scan register group is connected to a first pair of signal lines, the scan path connected to the second scan register group is connected to a second pair of signal lines, and the scan path connected to the third scan register group is connected to a third pair of signal lines.

5 Claims, 3 Drawing Sheets

CIRCUIT FOR TESTABILITY

BACKGROUND OF THE INVENTION

1. Field of the Invention

The present invention relates to an evaluation facilitating circuit for a logic circuit or the like to be packaged on a system LSI, and particularly to the composition of scan paths for serial scanning.

2. Description of the Prior Art

Recently, logic circuits packaged on a system LSI have become large so that there is a problem the length of that the testing time for the logic circuits has become a large portion of the time in the manufacture thereof. A parallel scan method and a serial scan method that are well known in the prior art as an effective method of testing the logic circuits. In the parallel scan method, it is possible to designate addresses of any given registers which are objects of the test in the logic circuit. Accordingly, the method can effectively carry out various tests for the logic circuits. However, it requires many circuit elements for the test alone, and the total size of the system becomes large.

In the serial scan method, addresses of a serial group of registers are conducted so that reading and writing in each register group, comprising a plurality of registers is designated. Since, the address designation is conducted corresponding to each register group, the serial scan method requires relatively few circuit elements for the address designation as compared with the parallel scan method. However, in this case, entire register groups whose addresses are to be designated must be scanned even if it is unnecessary, which takes a great deal of time.

As a countermeasure to solve these problems, a method in which a plurality of scan paths are scanned at the same time by internal buses as a common bus, and the method in which scan paths are provided in respective functional blocks in the logic circuit so that tests for the functional blocks are independently carried out have been implemented.

Generally, the scan path is a wiring through which test data and a result of a functional test operation are transferred to and from a target functional block.

The latter method above-described, that is, the method in which scan paths are provided in the respective functional blocks, is superior in that the functional blocks can be tested independently. However, when the mutual relations among the respective functional blocks are tested as a combinational circuit in which input and output portions of the functional blocks are arranged, dummy test data must be set even in register groups other than those which are objects of the tests on the functional blocks. Accordingly, the test requires a great deal of time.

SUMMARY OF THE INVENTION

It is therefore an object of the present invention to provide an evaluation facilitating circuit, which can efficiently carry out tests on respective functional blocks and a combinational circuit defined among the respective functional blocks.

To achieve the above object, an evaluation facilitating circuit, according to the present invention, incorporated in a logic circuit having a plurality of functional blocks, comprises: a plurality of register groups obtained by dividing a plurality of registers provided in each functional block; a plurality of scan paths for scanning a plurality of test data used for input and output operations for the register groups, a scan path being provided to each register group; and control means for designating the scan paths and controlling the input and output operations of test signals used for testing the register groups wherein a first register group in each functional group is composed of registers only used for the input operations to other functional blocks, a second register group is composed of registers only used for the output operations to other functional blocks and a third register group is composed of registers used for the input and output operations to the same functional block, and each scan path is connected to a common bus provided in the functional circuit, the common bus having a plurality of signal lines through which the test data is transferred, and the scan path connected to a first pair of signal lines, the scan path connected to the second register group are connected to a second pair of signal lines, and the scan path connected to the third register group are connected to a third pair of signal lines.

According to the evaluation facilitating circuit having the above-mentioned composition, only addresses of the scan paths to be connected to the register groups related to the input and output can be used when the tests on the combinational circuit defined among the respective functional blocks are conducted. Thus, the tests can be efficiently carried out.

These and other objects, features and advantages of the present invention will be more apparent from the following description of preferred embodiments, taken in conjunction with the accompanying drawings.

DETAILED DESCRIPTION OF THE EMBODIMENT

Hereinafter, embodiments of the present invention will be described with reference to FIGS. 1, 2 and 3.

Figure 1:
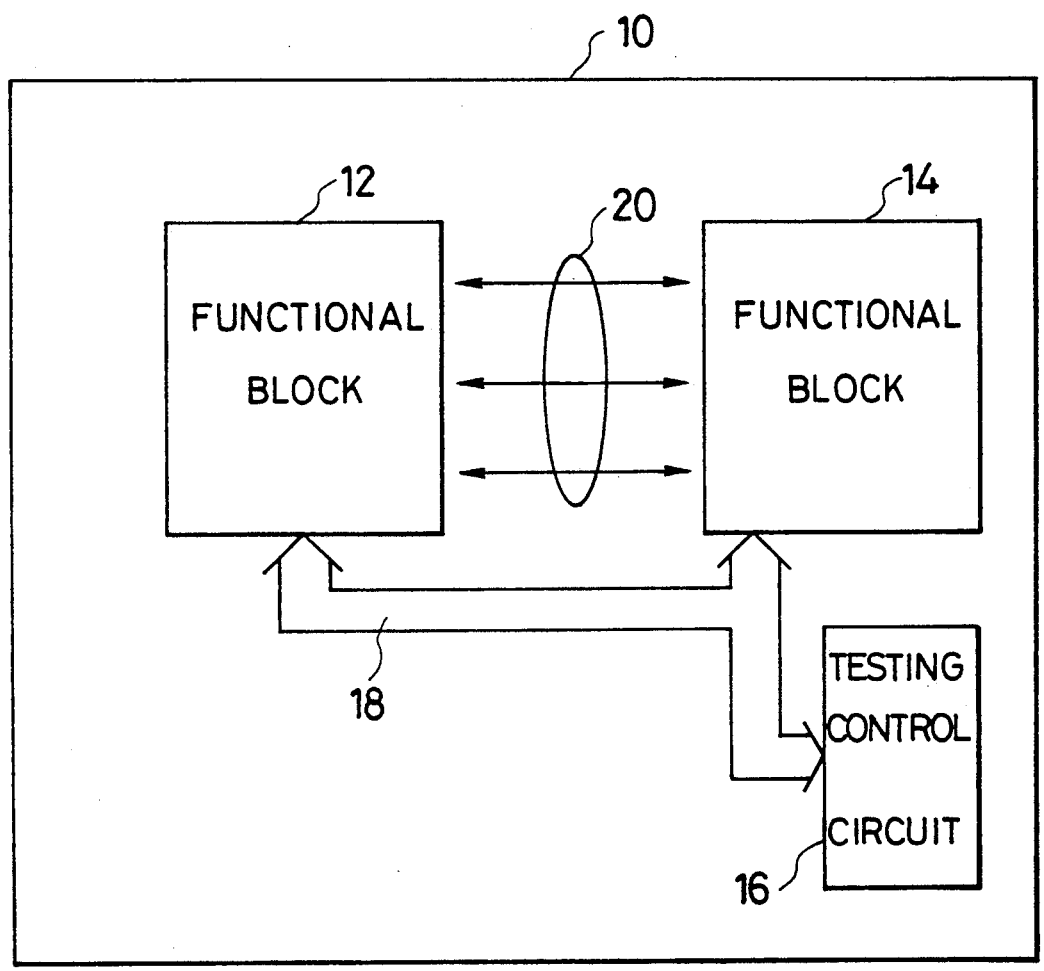
FIG. 1 is a schematic block diagram of a system LSI having an evaluation facilitating circuit according to the present invention.

FIG. 1 is a schematic block diagram of system LSI with an evaluation facilitating circuit according to the present invention.

In the diagram, reference numerals 12 and 14 respectively designate functional blocks including a combinational circuit, a group of storage means and the like. Moreover, 16 indicates a testing control circuit, and 18 shows a common bus for connecting the functional blocks 12, 14 and the testing control circuit 16. Further, 20 shows an internal bus used for input and output of data transmitted between the functional blocks 12 and 14. The above-mentioned functional blocks 12 and 14, testing control circuit 16, common bus 18 and internal bus 20 are all incorporated in a one-chip LSI.

In LSI 10 having composition as stated above, operational tests on the functional blocks 12 and 14 are carried out under the control of the testing control circuit 16.

Figure 2:
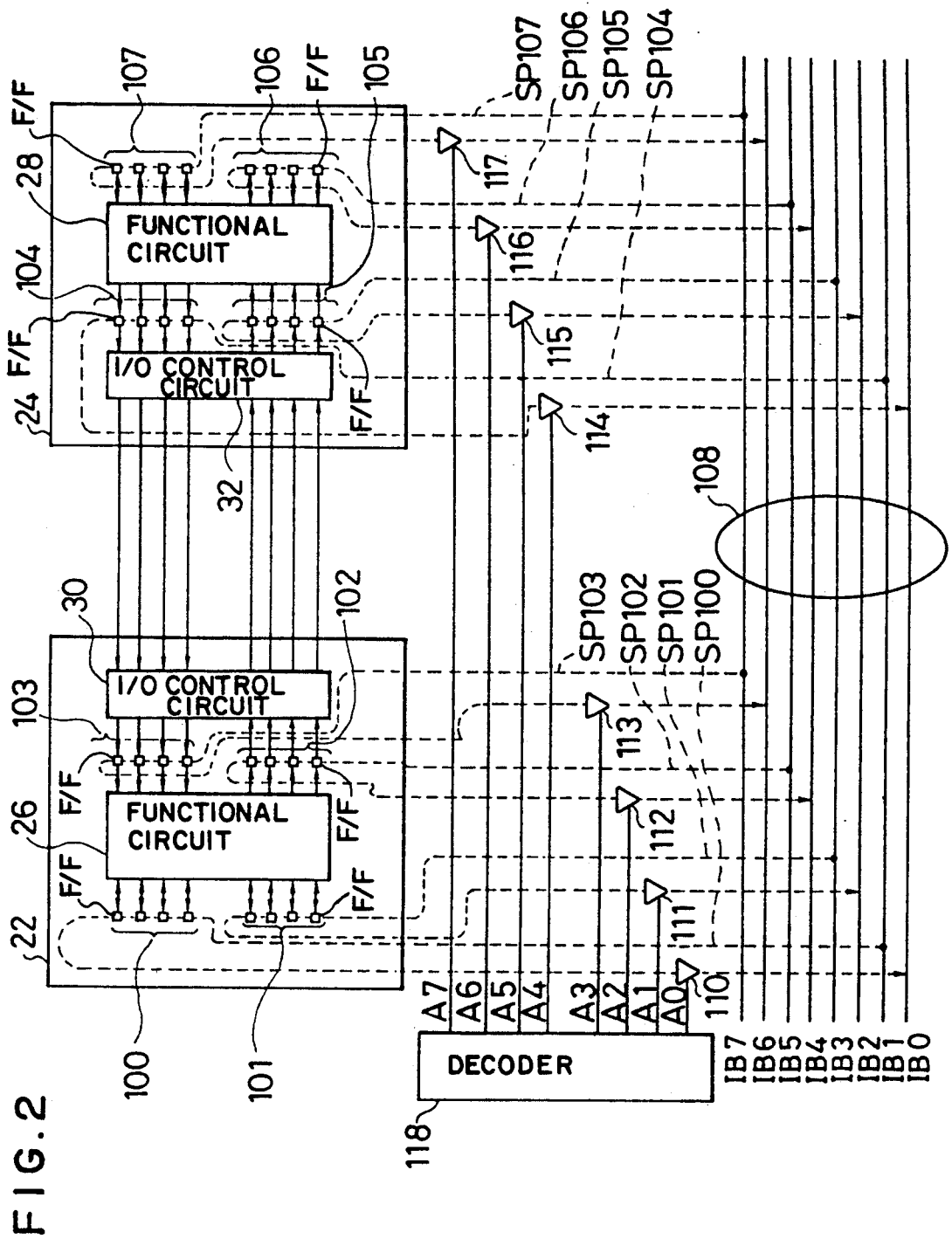
FIG. 2 is a block diagram of a logic circuit with an evaluation facilitating circuit, which is an embodiment according to the present invention.

FIG. 2 is a block diagram of a logic circuit with an evaluation facilitating circuit, which is an embodiment of the present invention. In the same diagram is shown an evaluation facilitating circuit a logic circuit, which is mainly composed of functional blocks 22 and 24. The functional blocks 22 and 24 respectively include a pair of functional circuits 26 and 28 for effecting processes corresponding to the respective functions thereof, and input-output (I/O) control circuits 30 and 32 for controlling input and output between the functional blocks 22 and 24. In a plurality of scan register groups 100, 101, 102, 103, 104, 105, 106 and 107 in the embodiment each group includes four scan registers, for example flip-flops (F/F), as storage means. Moreover, these register groups 100–107 are respectively connected to scan paths, SP100, SP101, SP102, SP103, SP104, SP105, SP106 and SP107, through which a plurality of test data are transferred from the common bus to the functional blocks, then the result of a functional test is also transferred from the functional blocks to the common bus. The four F/F forming each register group are connected in series to the scan paths. Additionally, a plurality of switch elements 110, 111, 112, 113, 114, 115, 116 and 117 are provided as selecting means for the respective scan paths. One of these switch elements is selected and driven through the signal lines of a plurality of address buses A0–A7 by a decoder 118 that is one of control means. In such a manner, the decoder 118 outputs control signals for designating register groups to be objects of the test. Therefore each switch element enters the active or the inactive state.

The registers in the embodiment shown in FIG. 2 are divided into groups based on predetermined functions thereof. For example, the registers are classified into registers belonging to functional circuits 26 and 28, and those belonging to output control circuits or input control circuits 30 and 32. One register group must be formed with registers of the same function. The scan paths SP100–SP107 are connected different bus lines IB0–IB7 respectively. In this case, scan paths which can be selected and operated at the same time are connected to different bus lines as explained in more detail hereinafter.

The register group 100 is connected to the bus lines IB0 and IB1 through the scan path SP100,
101 is connected to IB2 and IB3 through SP101,
102 is connected to IB4 and IB5 through SP102,
103 is connected to IB6 and IB7 through SP103,
104 is connected to IB0 and IB1 through SP104,
105 is connected to IB2 and IB3 through SP105,
106 is connected to IB4 and IB5 through SP106, and
107 is connected to IB6 and IB7 through SP107.

Next, an explanation of the operation of the evaluation facilitating circuit of this embodiment having the above-mentioned composition will be given.

When the functional circuits 26 and 28 are independently tested, the decoder 118 generates and transmits control signals to the switch elements 110–117. Then through scan paths to be selected by the signals, the input and output of data to the register groups belonging to the selected scan paths are conducted. For example, when the scan path SP100 is selected, the four registers composing the register group 100 are targets of the test.

Next, an explanation of tests among the respective blocks will be given.

In this case, the switch elements 112, 113, 114 and 115 are selected by the decoder 118. Therefore, the selected switch elements are activated. Test data is input to the register groups 104 and 102 through the signal lines of the common bus IB0, IB1, IB4, and IB5 (which will be omitted as common bus lines hereinafter) to determine test conditions of the I/O control circuits 30 and 32. The data from the operational results of the I/O control circuits 30 and 32 is output through the common bus lines IB2, IB3, IB6 and IB7 by scanning the register groups 105 and 103.

Time $T_{t1}$ required for the test between the functional blocks is obtained in the following manner. When the longer scan time in the scan paths SP102 and SP104 is L1, and the longer scan time in the scan paths SP103 and SP105 is L2, the time $T_{t1}$ required for the test can be approximately shown by the following equation:

$$T \approx (L1 + L2) \times T_c$$

where $T_c$ is the time required to scan each register (flip-flop).

Table 1 shows the relationship between the input and output of the test data in the respective register groups in the operation of this embodiment as described above. In the table, numeral 1 in the input row means input of the test data to each the corresponding register group, and numeral 1 in the output row means output of the operational results from each register group to the internal bus 108 through the corresponding switch elements. Numeral 0 in the table means that neither input nor output was conducted.

As clearly shown in the table, the test can be conducted with great efficiency, since only the register groups 102, 103, 104 and 105 need to be operated in the combinational tests between the I/O control circuits 30 and 32.

TABLE 1

| OBJECT OF TEST | REGISTER GROUP | 100 | 101 | 102 | 103 | 104 | 105 | 106 | 107 |
|---|---|---|---|---|---|---|---|---|---|
| FUNCTIONAL BLOCK 22 | INPUT | 1 | 1 | 1 | 1 | 0 | 0 | 0 | 0 |
|  | OUTPUT | 1 | 1 | 1 | 1 | 0 | 0 | 0 | 0 |
| FUNCTIONAL BLOCK 24 | INPUT | 0 | 0 | 0 | 0 | 1 | 1 | 1 | 1 |
|  | OUTPUT | 0 | 0 | 0 | 0 | 1 | 1 | 1 | 1 |
| BETWEEN I/O CONTROL CIRCUITS 30 AND 32 | INPUT | 0 | 0 | 1 | 1 | 1 | 1 | 0 | 0 |
|  | OUTPUT | 0 | 0 | 1 | 1 | 1 | 1 | 0 | 0 |

Figure 3:
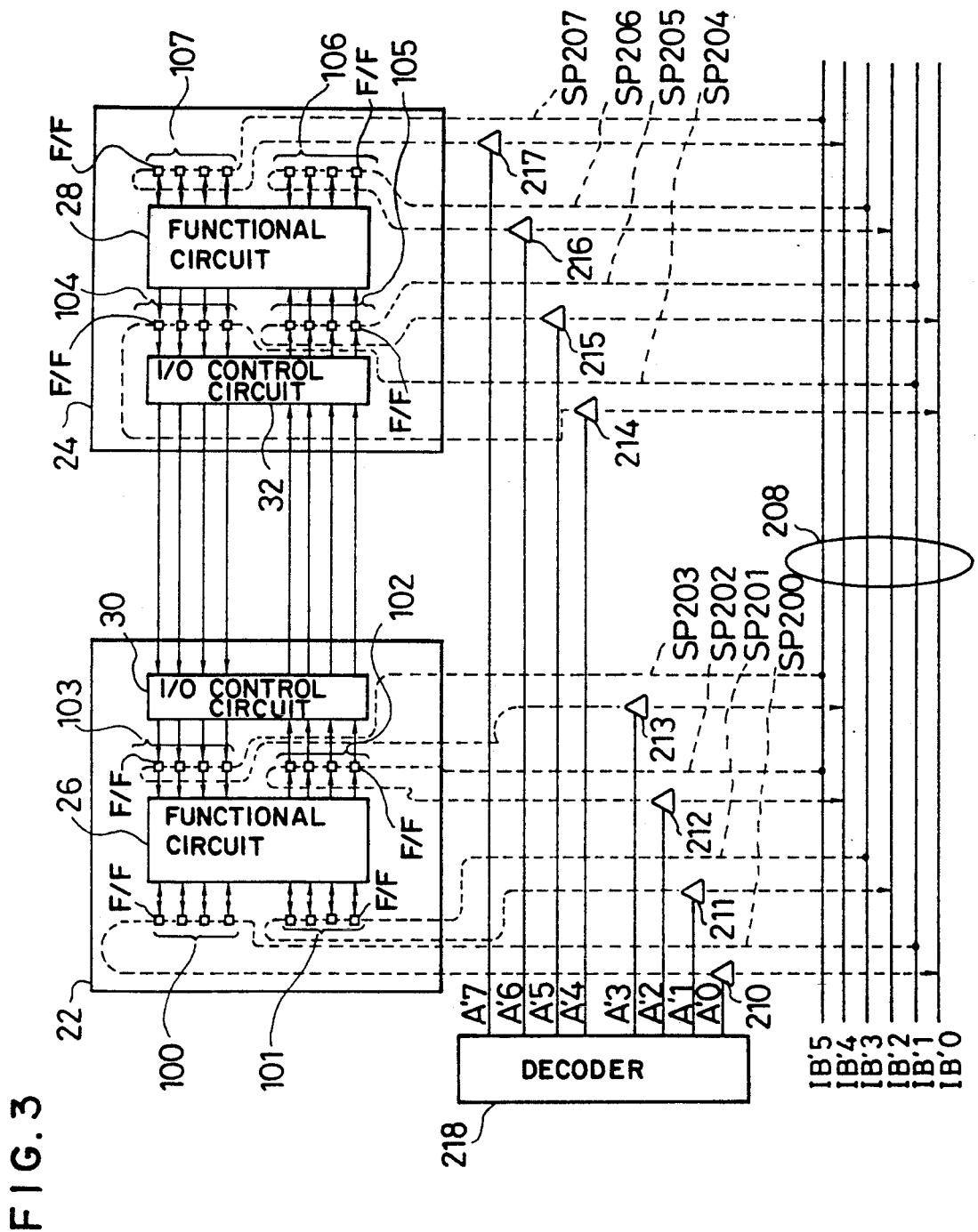
FIG. 3 is a block diagram of a logic circuit circuit for testability, which is another embodiment of the present invention.

FIG. 3 is a compositional diagram of a logic circuit including an evaluation facilitating circuit, which is another embodiment of the present invention. In the diagram, reference characters SP200, SP201, SP202, SP203, SP204, SP205, SP206 and SP207 designate scan paths corresponding to register groups 100–107 respectively. In the respective scan paths SP200–SP207 a plurality of switch elements 210-217 selected and driven by a decoder 218 are provided. The driving manner in this case is the same as described in the first embodiment. Reference numeral 208 indicates a common bus that includes six bus lines IB'0, IB'1, IB'2, IB'3, IB'4 and IB'5.

Moreover, in the drawing, the register group 100 is connected to the bus lines IB'0 and IB'1 through the scan path SP200,
101 is connected to IB'2 and IB'3 through SP201,
102 is connected to IB'4 and IB'5 through SP202,
103 is connected to IB'4 and IB'5 through SP203,
104 is connected to IB'0 and IB'1 through SP204,
105 is connected to IB'0 and IB'1 through SP205,
106 is connected to IB'2 and IB'3 through SP206, and
107 is connected to IB'4 and IB'5 through SP207.

In the evaluation facilitating circuit of this embodiment, when the functional circuits 26, 28 and the combinational circuit formed between the I/O control circuits 30 and 32 are tested independently, a scan-out of the registers used for input is not carried out when the test data is input. Namely, a scan out of the registers relating to input is not conducted. To the contrary, scan-in of the registers used for output is not carried out when the test data is output. Accordingly, the scan paths SP202 and SP203 respectively connected to the register groups 102 and 103 can be connected to the same bus lines IB'4 and IB'5. Namely, when the functional circuit 26 is tested, the test data is input into the register group 103 through the scan path SP203 from the bus line IB'5, and the contents of the register group 102 are outputted to the bus line IB'4 through the switch elements 212. Moreover, when the I/O control circuit 30 is tested, the test data is input into the register group 102 through the scan path SP202 from the bus line IB'5, while the contents of the register group 103 are output to the bus line IB'4 through the switch elements 213. Similarly, the scan paths SP204 and SP205 respectively connected to the register groups 104 and 105 can be connected to the same address buses IB'0 and IB'1. Accordingly, the common bus 208 required in the embodiment can be composed of the six address buses, so that the size of a system LSI to be composed therewith can be considerably reduced.

Table 2 shows the relationship between the input and output of the test data in the respective register groups 100–107 of the evaluation facilitating circuit of this embodiment. In the table, numeral 1 means that either input or output of the test data has been carried out, while numeral 0 means that neither input nor output was carried out.

As clearly shown in the table, the evaluation facilitating circuit according to the embodiment can perform combinational tests (of the I/O control circuit 30 and 32) between the functional blocks 22 and 24 using only the register groups 102, 103, 104 and 105.

Accordingly, it is not necessary to set dummy test data in the register groups 100, 101, 106 and 107 that are not directly related to the tests.

TABLE 2

| OBJECT OF TEST | REGISTER GROUP | 100 | 101 | 102 | 103 | 104 | 105 | 106 | 107 |
|---|---|---|---|---|---|---|---|---|---|
| FUNCTIONAL BLOCK 22 | INPUT | 1 | 1 | 0 | 1 | 0 | 0 | 0 | 0 |
| | OUTPUT | 1 | 1 | 1 | 0 | 0 | 0 | 0 | 0 |
| FUNCTIONAL BLOCK 24 | INPUT | 0 | 0 | 0 | 0 | 0 | 1 | 1 | 1 |
| | OUTPUT | 0 | 0 | 0 | 0 | 1 | 0 | 1 | 1 |
| BETWEEN I/O CONTROL CIRCUITS 30 AND 32 | INPUT | 0 | 0 | 1 | 0 | 1 | 0 | 0 | 0 |
| | OUTPUT | 0 | 0 | 1 | 0 | 1 | 0 | 0 | 0 |

In the above embodiments, the register groups 100, 101, 102, 103, 104, 105, 106 and 107 are respectively composed of four registers (F/F), however, the respective numbers of the registers (F/F) in these register groups may differ.

Generally, in a logic circuit, the number of registers (F/F) composing each register group differs per register group.

Accordingly, in case of an ordinary evaluation facilitating circuit for which test data must be set (including dummy data) in the whole register groups in functional blocks, and when the number of registers belonging to the register groups that do not contribute to the tests is larger than that of registers in the register groups which contribute to the tests, time $T_t$ required for the tests can be expressed by the following equation:

$$T_t \div 2 \times L_3 \times T_c$$

where $L_1$ is the number of registers in the register group requiring a longest scanning time in register groups to which the test data is input, $L_2$ is the number of registers in the register group requiring a longest scanning time in register groups from which results of the tests are output, $L_3$ is the number of registers which do not contribute to the tests, and these $L_1$, $L_2$ and $L_3$ satisfy the expression:

$$L_3 > L_1 \text{ and } L_3 > L_2.$$

Moreover, in the above equation, coefficient 2 shows that these $L_3$ pieces of registers are scanned twice to input the test data first and then output the result data from these functional circuits.

Also, the following equation:

$$2 \times L_3 > (L_1 + L_2)$$

can be established, the relation between $T_t$ and the above mentioned time $T_{t1}$ which is required for the tests between the functional blocks can be expressed by the following equation:

$$T_t > T_{t1}.$$

Accordingly, the time required for the tests becomes inefficiently long when the number of registers in the register groups becomes large.

To the contrary, in the evaluation facilitating circuit according to the embodiment, since it is possible to set the test data only in the register groups that contribute to the tests, the testing efficiency can be greatly improved.

Various modifications will become possible for those skilled in the art after receiving the teachings of the present disclosure without departing from the scope thereof.

What is claimed is:

1. An evaluation facilitating circuit incorporated in a logic circuit having a plurality of functional blocks, comprising:
    a plurality of register groups obtained by dividing a plurality of registers provided in each functional block;
    a plurality of scan paths for scanning a plurality of test data used for input and output operations for the register groups, a scan path being provided for each register group: and
    control means for designating the scan paths and controlling the input and output operations of test signals used for testing the register groups,
    wherein a first register group in each functional block is composed of registers used only for the input operations to other functional blocks, a second register group is composed of registers used only for the output operations to other functional blocks and a third register group is composed of registers used for input and output operations to the same functional block, and wherein
    each scan path is connected to a common bus provided in the logic circuit, the common bus comprising a plurality of signal lines through which the test data is transferred, and
    the scan path connected to the first register group is connected to a first pair of signal lines, the scan path connected to the second register group is connected to a second pair of signal lines, and the scan path connected to the third register group is connected to a third pair of signal lines.

2. An evaluation facilitating circuit according to claim 1, wherein each scan path further comprises a switching means connected to the controlling means to address the scan path.

3. An evaluation facilitating circuit incorporated in a logic circuit having a plurality of functional blocks, comprising:
    a plurality of register groups obtained by dividing a plurality of registers provided in each functional block;
    a plurality of scan paths for scanning a plurality of test data used for input and output operations for the register groups, a scan path being provided for each register group; and
    control means for designating the scan paths and controlling the input and output operations of test signals used for testing the register groups,
    wherein a first register group in each functional group is composed of registers used only for the input operations to other functional blocks, a second register group is composed of registers used only for the output operations to other functional blocks and a third register group is composed of registers used for input and output operations to the same functional block, and
    each scan path is connected to a common bus provided in the logic circuit, the common bus comprising a plurality of signal lines through which the test data is transferred, and
    scan paths connected to the first register group and the second register group are connected to a same pair of signal lines, and the scan path connected to the third register group is connected to another pair of signal lines.

4. An evaluation facilitating circuit according to claim 3, wherein each register group comprises shift registers.

5. An evaluation facilitating circuit according to claim 3, wherein each scan path further comprises a switching means connected to the controlling means to address the scan path.